United States Patent [19]
Takada

[11] Patent Number: 5,847,316
[45] Date of Patent: Dec. 8, 1998

[54] ELECTROMAGNETIC SHIELDING BODY AND ELECTROMAGNETIC SHIELDING STRUCTURE UTILIZING SAME

[75] Inventor: Youichi Takada, Chiba-Ken, Japan

[73] Assignee: Kabushiki Kaisha Toshiba, Kawasaki, Japan

[21] Appl. No.: 254,585

[22] Filed: Jun. 6, 1994

[30] Foreign Application Priority Data

Jun. 7, 1993 [JP] Japan .................................. 5-136175

[51] Int. Cl.⁶ .................................................. H05K 9/00
[52] U.S. Cl. .......................... 174/35 MS; 49/404; 52/207
[58] Field of Search .................................. 361/616, 818,
361/816; 428/615, 617, 619, 678, 679;
174/35 MS, 35 R; 49/404; 52/207

[56] References Cited

U.S. PATENT DOCUMENTS

| | | | |
|---|---|---|---|
| 2,405,987 | 8/1946 | Arnold | 174/35 R |
| 2,704,301 | 8/1955 | Arnold | 174/35 MS |
| 3,153,692 | 10/1964 | Lindgren | 174/35 MS |
| 3,230,375 | 1/1966 | Wagoner et al. | 428/192 |
| 3,691,688 | 9/1972 | Kaiserwerth | 292/251.5 |
| 3,982,058 | 9/1976 | Hill | 174/35 MS |
| 4,370,831 | 2/1983 | Hamilton | 174/35 MS |
| 4,651,099 | 3/1987 | Vinegar et al. | 324/320 |
| 4,729,326 | 3/1988 | Richter | 52/267 |
| 4,748,790 | 6/1988 | Frangolacci | 174/35 MS |
| 4,806,703 | 2/1989 | Sims | 174/35 MS |
| 4,831,210 | 5/1989 | Larson et al. | 174/35 MS |
| 4,953,324 | 9/1990 | Herrmann | 174/35 MS |
| 5,043,529 | 8/1991 | Vanesky et al. | 174/35 MS |
| 5,045,636 | 9/1991 | Johnasen et al. | 174/35 MS |
| 5,063,273 | 11/1991 | Bloks | 174/35 R |
| 5,139,850 | 8/1992 | Clark et al. | 428/192 |
| 5,147,694 | 9/1992 | Clarke | 428/34 |
| 5,197,225 | 3/1993 | Yff | 174/35 MS |
| 5,260,128 | 11/1993 | Ishii et al. | 428/328 |
| 5,452,550 | 9/1995 | Vanesky et al. | 52/173.1 |

FOREIGN PATENT DOCUMENTS 405343881A 12/1993 Japan .

*Primary Examiner*—Bot L. Ledynh
*Assistant Examiner*—Hung V. Ngo
*Attorney, Agent, or Firm*—Foley & Lardner

[57] ABSTRACT

An electromagnetic shielding body is formed of a first ferromagnetic member, at least one second ferromagnetic member disposed substantially in parallel to the first ferromagnetic member with a space and having a magnetic permeability different from that of the first ferromagnetic member, and an electrically conductive member disposed between and substantially in parallel to the first and second ferromagnetic members with spaces therebetween. A electromagnetic shielding panel is formed essentially by means of an electric connecting member electrically integrated with the conductive member, the electric connecting member being formed along an edge portion of the conductive member. Such panel is utilized for forming an electromagnetic shielding structure such as door, exit/entrance structure for a room, an electromagnetic shielding structure having a through-hole member, and an electromagnetic shielding room structure.

23 Claims, 5 Drawing Sheets

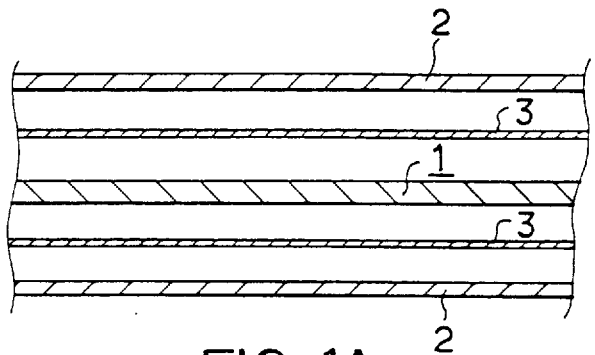
FIG. 1A
FIG. 1B
FIG. 1C
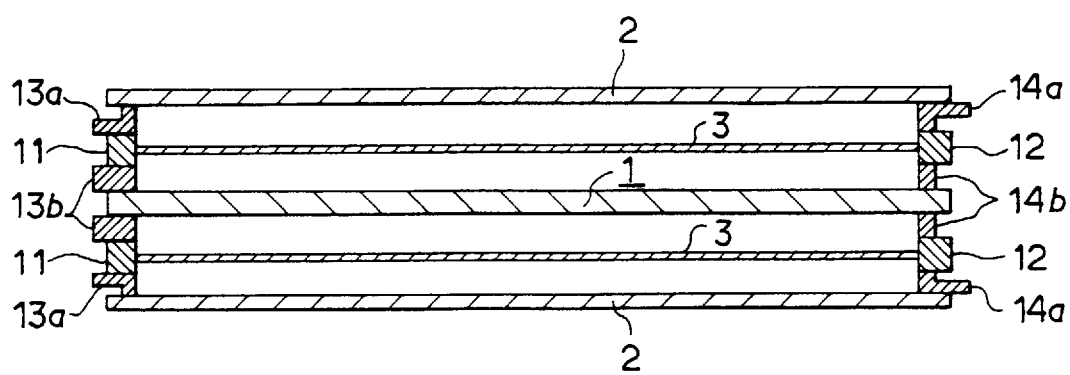
FIG. 2A
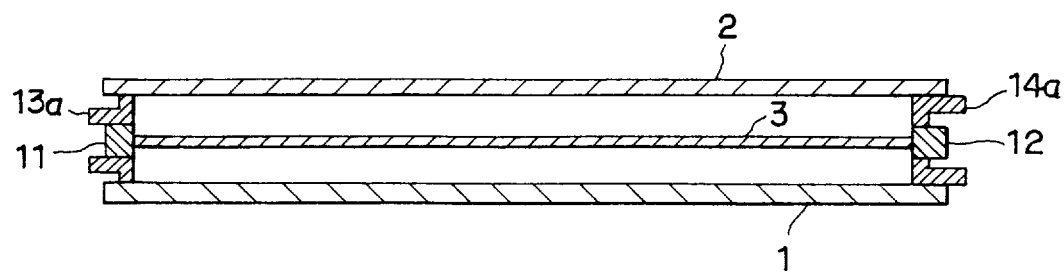
FIG. 2B

ELECTROMAGNETIC SHIELDING BODY AND ELECTROMAGNETIC SHIELDING STRUCTURE UTILIZING SAME

BACKGROUND OF THE INVENTION

1. Field of the Invention

The present invention relates to an electromagnetic body capable of achieving high shielding performance from electromagnetic waves in a wide band of frequencies, and also relates to structures or assemblies such as elecromagnetic shielding panel, door structure, wall structure or room structure utilizing the electromagnetic shielding body.

2. Related Prior Art

An electromagnetic shielding body or member is utilized for electromagnetically shielding an inside space from an outside space or vice versa, and an electromagnetic room is also a room for electromagnetically shielding an internal space from an external space or vice versa. The electromagnetic shielding room is classified as either a passive type which prevents electromagnetic waves or lines of magnetic force from entering the chamber from outside, or a positive type which prevents electromagnetic waves leaking from a high-power, high frequency apparatus situated indoor or lines of magnetic force leaking from a high magnetic field generating apparatus, from escaping outside.

Conventional electromagnetic shielding rooms are electromagnetically shielded by different shielding methods depending on which frequency band electromagnetic waves or lines of magnetic force are being shielded from. The electromagnetic shielding using the action of an electromagnetic induction is effective for electromagnetic waves of several hundreds kHz or more.

Because the shielding method using the action of electromagnetic induction is not so effective for electromagnetic waves of less than several kHz, generally, an electromagnetic shielding method is employed according to such a character in that lines of magnetic force are concentrated inside a ferromagnetic substance.

According to a shielding method based on the electromagnetic induction, a shielding area is surrounded by metallic material such as electrolytic copper foil having a high conductivity in order to generate eddy current in the metallic material when electromagnetic waves are received, and then shielding from electromagnetic waves having a high frequency is performed by magnetic flux generated by the eddy current.

On the other hand, according to a shielding method using a ferromagnetic substance, a shielding area is surrounded by a magnetic substance such as permalloy having a high magnetic permeability to concentrate lines of magnetic force to the inside of the ferromagnetic substance, thereby shielding such area from magnetic lines having a low frequency.

However, generally, a ferromagnetic substance having a high magnetic permeability, such as permalloy, is likely to be magnetically saturated and the shielding efficiency thereof drops in a high magnetic field. Additionally, ferromagnetic substances such as permalloy have low resistance to stress. In a portion in which a load is applied and, particularly, where a supporting member for supporting equipment, such as a bed or a gantry or the like, which is provided in an electromagnetic shielding room, for example, diagnosis room, is fixed, or in the case of a door portion on which a load is applied repeatedly, the magnetic permeability drops, thereby reducing the electromagnetic shielding efficiency.

It is possible to prevent stress from being applied to a magnetic substance by inserting a supporting member into a through-hole formed on the wall and floor of the electromagnetic shielding room. However, if the through-hole is formed in a conductive substance provided in order to shield the room from high frequency, that portion acts as an antenna, thereby reducing the shielding effect from high frequency.

SUMMARY OF THE INVENTION

An object of the present invention is to substantially eliminate defects or problems encountered in the prior art described above and to provide an electromagnetic shielding body or member, an electromagnetic shielding panel, and other electromagnetic shielding structure, utilizing the electromagnetic shielding body or panel, such as electromagnetic shielding exit/entrance structure, an electromagnetic shielding structure having a through-hole, and an electromagnetic shielding room in which the magnetic shielding capacity can be improved by solving problems relating to magnetic saturation of a ferromagnetic substance and stress.

These and other objects can be achieved according to the present invention by providing, in one aspect, an electromagnetic shielding body comprising:

a first ferromagnetic member and at least one second ferromagnetic member disposed substantially in parallel to the first ferromagnetic member with a space and having a magnetic permeability different from that of the first ferromagnetic member.

In this aspect, in the preferred embodiment, the electromagnetic shielding body further comprises an electrically conductive member disposed between and substantially in parallel to the first and second ferromagnetic members with spaces therebetween. The second ferromagnetic members is disposed on a side at which a magnetic force is generated. Two second ferromagnetic members are disposed on both sides of the first ferromagnetic member in parallel thereto with spaces.

In another aspect of the present invention, there is provided an electromagnetic shielding panel comprising:

at least one ferromagnetic member formed in shape of panel;

an electrically conductive member formed in shape of a panel and disposed substantially in parallel to the ferromagnetic member; and an electric connecting member electrically integrated with the conductive member, the electric connecting member being formed along an edge portion of the conductive member. Edge portions of the ferromagnetic member and the electric connecting member are connected to each other through a spacer means which is formed of an insulator.

An electromagnetic shielding panel structure comprises at least two electromagnetic shielding panels, each of the electromagnetic shielding panels comprising at least one ferromagnetic member formed in shape of panel, an electrically conductive member formed in shape of a panel and disposed substantially in parallel to the ferromagnetic member, and an electric connecting member electrically integrated with the conductive member, the electric connecting member being formed along an edge portion of the conductive member, wherein the electric connecting member of one of the electromagnetic shielding panels contacts another adjacent one of the electromagnetic shielding panels to form an electromagnetic shielding panel structure.

This electromagnetic shielding panel structure can be formed as an electromagnetic shielding door structure.

In a further aspect of the present invention, there is provided an electromagnetic shielding exit/entrance structure comprising:

an electromagnetic shielding panel comprising at least one ferromagnetic member formed in shape of panel having a cutout portion forming a first opening of a predetermined size, the electromagnetic shielding panel having a second opening formed to an edge portion thereof defining the first opening, an electrically conductive member formed in shape of a panel and disposed substantially in parallel to the ferromagnetic member, the electrically conductive member having an opening with a size corresponding to that of the ferromagnetic member, and an electric connecting member electrically integrated with the conductive member, the electric connecting member being formed along an edge portion of the conductive member; and an electromagnetic shielding door member comprising at least one ferromagnetic member formed in shape of panel having a size larger than that of the first opening of the ferromagnetic member, an electrically conductive member formed in shape of a panel and disposed substantially in parallel to the ferromagnetic member, and an electric connecting member electrically integrated with the conductive member, the electric connecting member being formed along an edge portion of the conductive member, wherein the electromagnetic shielding door member is fitted to the first opening of the electromagnetic shielding panel to be slidable into the second opening thereof so as to open or close the first opening and the electric connecting member of the electromagnetic shielding panel contacts the electric connecting member of the electromagnetic shielding door member when the electromagnetic shielding door structure closes the first opening of the electromagnetic shielding panel.

In a still further aspect of the present invention, there is provided an electromagnetic shielding structure having a through hole comprising:

an electromagnetic shielding panel comprising ferromagnetic members provided with through-holes at portions corresponding to each other and an electric conductive member disposed between and substantially in parallel to the ferromagnetic members; and an insert body to be inserted into the through holes of the ferromagnetic members, the insert body comprising two insert portions which pass through the through-holes, the two through portions being connected to each other with the electric conductive member being interposed therebetween.

In this preferred embodiment, the ferromagnetic members include a first ferromagnetic member and second ferromagnetic members which are disposed on both sides of the first ferromagnetic member, substantially in parallel thereto and which have a magnetic permeability smaller than that of the first ferromagnetic member, the conductive member being disposed on both sides of the first ferromagnetic member and between the first ferromagnetic member and the second ferromagnetic members, the two insert portions of the insert body being connected to each other through a connecting member.

The insert body is formed of a diamagnetic substance or non-magnetic substance, or a poaramagnetic substance.

Another ferromagnetic member is disposed at a portion near the inserted portion of at least one of the insert portions of the insert body, a further ferromagnetic member is disposed at a portion surrounding the at least one of the insert portions of the insert body, and a still further ferromagnetic member is disposed on an outer peripheral surface of at least one of the insert portions of the insert body, these ferromagnetic members being disposed alone or in combination thereof.

In a still further aspect of the present invention, there is provided an electromagnetic shielding room which can be composed of preferred combination of the above electromagnetic shielding body, panel, exit/entrance structure, through hole structure and others.

In the electromagnetic shielding body according to the present invention, if a second ferromagnetic member is disposed at the side in which a magnetic field generating source exists, lines of magnetic force first enter the second ferromagnetic member. Because the magnetic permeability of the second ferromagnetic member is small but the magnetic saturation thereof is high, the second ferromagnetic member is not magnetically saturated but capable of allowing some extent of the lines of magnetic force to pass therethrough even if the magnetic field is strong.

Then, the lines of magnetic force leaking from the second ferromagnetic member enters a first ferromagnetic member. Because the strength of the magnetic field is weaker at the position in which the first ferromagnetic member is located, the first ferromagnetic member is not likely to be magnetically saturated and the magnetic permeability of the first ferromagnetic is set to a high value. Thus, the most lines of magnetic force leaking from the second ferromagnetic member pass through the first ferromagnetic member.

According to a preferred embodiment of the present invention, a conductive member is disposed in parallel to the ferromagnetic member. Thus, high frequency electromagnetic waves generate eddy current in the conductive member, so that a magnetic flux induced by the eddy current shields from the high frequency electromagnetic wave.

According to another preferred embodiment of the present invention, the second ferromagnetic members are disposed on both sides of the first ferromagnetic member in order to avoid a load applied directly on the first ferromagnetic member.

Therefore, the function of the first ferromagnetic member which shields the lines of magnetic force effectively by a high magnetic permeability is maintained for a long time.

In the electromagnetic shielding panel of the present invention, the ferromagnetic member shields the lines of magnetic force and simultaneously the conductive member shields the high frequency electromagnetic wave. The location of the electric connecting members makes the conductive member electrically integrated with the conductive member of an adjacent panel, so that eddy current path is not restricted within individual panels.

In the electromagnetic shielding panel structure of the present invention, the electric connecting members of the panels in the vicinity are in contact with each other so that the conductive members of the respective panels become electrically integrated. Thus, eddy current flows freely throughout the conductive members electrically integrated, so that the current path is not restricted.

In the electromagnetic shielding door structure of the present invention, the ferromagnetic member shields the room from lines of magnetic force and simultaneously the conductive member shields the room from high frequency electromagnetic wave. Then, the electric connecting members integrate the conductive member of the door electrically with the conductive member of the door electromagnetic shielding panel, so that eddy current path is not restricted within the electromagnetic shielding door structure.

In the electromagnetic shielding exit/entrance structure of the present invention, when the electromagnetic shielding door is closed, the electric connecting member provided on the electromagnetic shielding door comes into contact with the electric connecting member provided on the electromagnetic shielding panel constituting a wall structure for the door, so that the conductive members provided on both the electromagnetic shielding door and the electromagnetic shielding panel for the door become electrically integrated. Thus, eddy current flows freely throughout the electrically integrated conductive members, so that the current path is not restricted.

In the electromagnetic shielding structure having a through-hole of the present invention, the conductive members maintain electric continuity at the position in which the insert body is located. Thus, eddy current flows freely in order to shield the room from the high frequency.

According to a preferred embodiment of the electromagnetic shielding structure having the through-hole of the present invention, a ferromagnetic member is provided near either of two insert portions which constitute the insert body. According to a further preferred embodiment, the ferromagnetic members of the insert portions are magnetically connected to each other or the ferromagnetic members are magnetically connected to ferromagnetic members of an electromagnetic shielding panel. Thus, the lines of magnetic force which pass through the through-hole are concentrated to the ferromagnetic member near the insert body and then the lines of magnetic force enter the ferromagnetic members of the electromagnetic shielding panel, so that the lines of magnetic force which enters the room through the through-hole are greatly reduced.

The nature and further features of the present invention will be made more clear from the following descriptions made with reference to the accompanying drawings.

BRIEF DESCRIPTION OF THE DRAWINGS

In the accompanying drawings:

FIG. 1 including FIGS. 1A, 1B and 1C, is a sectional view showing an embodiment of the electromagnetic shielding body of the present invention;

FIG. 2 including FIGS. 2A and 2B, is a sectional view of an electromagnetic shielding panel utilizing the electromagnetic shielding body of FIG. 1 of the present invention;

DESCRIPTION OF THE PREFERRED EMBODIMENTS

Figure 3A:
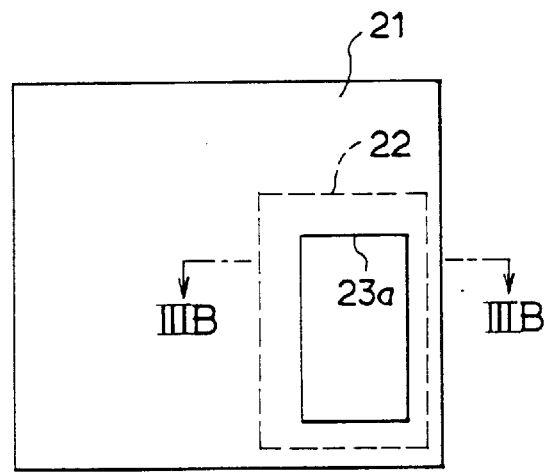
FIG. 3A is an illustration of a wall structure of an electromagnetic shielding room to which an electromagnetic shielding exit/entrance structure, e.g., a door structure, utilizing the electromagnetic shielding body of FIG. 1 or panel of FIG. 2, according to the present invention is applied.

Embodiments of electromagnetic shielding body and electromagnetic shielding structures of the present invention will be described with reference to the accompanying drawings.

In this specification, the term "electromagnetic shielding" does not mean "shielding" from high frequency components utilizing the action of the electromagnetic induction, but means "shielding" from, at least, a certain frequency band in a wide range from high frequency to low frequency.

First, referring to FIG. 1, an electromagnetic shielding body according to the present invention comprises first and second ferromagnetic members 1 and 2 having different magnetic permeabilities from each other. The second ferromagnetic substances 2 are disposed on both sides of and substantially in parallel to the first ferromagnetic member 1 so that there is a gap between the first ferromagnetic member 1 and each second ferromagnetic member 2. The gaps are empty spaces or may be filled up with a non-magnetic material for increasing the electromagnetic shielding performance.

The ferromagnetic member 1 may be formed of a high magnetic permeability alloy, the main component of which is nickel, such as permalloy, super-malloy, super-permalloy, mumetal, amorphous or silicon steel sheet. It is desirable that the ferromagnetic member 2 is made of, for example, iron, electrolytic iron foil or electrolytic copper foil.

The electromagnetic shielding body of the present invention further comprises conductive members 3 which are disposed between the first ferromagnetic members 1 and the second ferromagnetic members 2 and substantially in parallel thereto. It is desirable that the conductive members 3 are made of a material having a high conductivity, for example, electrolytic copper foil.

When the electromagnetic shielding body of the present invention is arranged at a place where electromagnetic waves of various frequencies exist, the shielding from high frequency is performed by mainly the conductive member 3 and the shielding from the low frequency is performed by mainly the first ferromagnetic member 1 and the second ferromagnetic member 2. Namely, the shielding from electromagnetic waves of high frequencies is performed by magnetic flux induced by eddy current which is generated in the conductive member 3.

Lines of magnetic force of low frequency enter the second ferromagnetic member 2. Because the second ferromagnetic member 2 has a high saturation magnetization although its relative magnetic permeability is low, the second ferromagnetic member 2 is capable of allowing some amount of lines of magnetic force to pass therethrough without being magnetically saturated even when a strong magnetic field exists.

The lines of magnetic force leaking from the second ferromagnetic member 2 pass the first ferromagnetic member 1. As the strength of the magnetic field is low at the position of the first ferromagnetic member, the first ferromagnetic member 1 is not likely to be magnetically saturated and the magnetic permeability thereof is adjusted to be high. Thus, most lines of magnetic force leaking from the second ferromagnetic member 2 pass the first ferromagnetic member 1. Consequently, the electromagnetic shielding body of the present invention is capable of effectively achieving the shielding from electromagnetic waves containing a variety of frequencies.

According to the electromagnetic shielding body of FIG. 1, since the second ferromagnetic members 2 are arranged on both sides of the ferromagnetic member 1, no load is directly applied to the first ferromagnetic member 1. Thus, the relative magnetic permeability of the ferromagnetic member 1 never drops when stress is applied to the ferromagnetic member 1, so that it is possible to maintain the high relative magnetic permeability of the first ferromagnetic member 1. Conventionally, a predetermined magnetic shielding rate was achieved by only a ferromagnetic member such as permalloy or the like. As compared with this conventional case, according to the present embodiment, the same magnetic shielding rate is achieved by combining two kinds of ferromagnetic members having different physical properties. Thus, it is possible to produce an electromagnetic shielding body at a lower cost than in the prior art.

Although, in the electromagnetic shielding body according to the present embodiment, the conductive members 3 and the second ferromagnetic members 2 are disposed on both sides of the first ferromagnetic members 1, if there is little possibility that stress is applied to the electromagnetic shielding body, it is permissible to dispose the conductive member 3 and the ferromagnetic member 2 on one side alone. In this case, the second ferromagnetic member 2 is disposed so as to face the side in which a magnetic field generating source exists. Furthermore, a plurality of the electromagnetic shielding bodies each shown in FIG. 1 may be arranged in parallel to each other to form an electromagnetic shielding body assembly as occasion demands.

Although the magnetic shielding body of the present invention may be specifically applied to an electromagnetic shielding room structure, the electromagnetic shielding body is not restricted to this example, but can be applied to various fields which require electromagnetic shielding.

As can be seen from the above disclosure, the most simple embodiment of the electromagnetic shielding body is that shown in FIG. 1B, in which two ferromagnetic members 1 and 2 having different magnetic permeabilities are disposed in parallel to each other.

Further, as shown in FIG. 1C, in the next embodiment, the electric conductive member 3 is disposed between these ferromagnetic members 1 and 2 in parallel thereto.

Next, an embodiment of the electromagnetic shielding panel of the present invention will be described hereunder with reference to FIG. 2 showing an electromagnetic shielding panel utilizing the electromagnetic shielding body of FIG. 1A, and accordingly, the same reference numerals are attached to substantially the same parts as in the electromagnetic shielding body shown in FIG. 1A, so that the description thereof is omitted.

It is of course to be noted that the embodiments of the electromagnetic shielding bodies of FIGS. 1B and 1C may be applied to the electromagnetic shielding panel such as shown in FIG. 2, and also noted that, in the various embodiments of the present invention described hereinafter, the electromagnetic shielding panels (or bodies) of the structure of FIG. 2A (or 1A) or FIG. 2B (or 1C) may be applied even if the specific disclosure in this matter be not made herein.

In the electromagnetic shielding panel of the present invention, electric connecting members 11 and 12 which are formed along the edges of the conductive members 3, so as to be electrically integrated with the conductive member 3, are added thereto. If different electromagnetic shielding panels are placed near each other, the electric connecting members 11 and 12 come into contact with the electric connecting members 12 and 11 of the adjacent electromagnetic shielding panels.

In the electromagnetic shielding panel of FIG. 2A, the edges of the ferromagnetic members 1 and 2 are connected to the electric connecting members 11 and 12 through spacers 13a, 13b and 14a, 14b, which are made of FRP (corrugated sheet) or the like which is an electrically insulating and non-magnetic substance. When different electromagnetic shielding panels are placed near each other, the spacers 13a, 13b and 14a, 14b engage with the adjacent spacers 14a, 14b and 13a, 13b of electromagnetic shielding panels, so that the ferromagnetic members 1 and 2 of the adjacent electromagnetic shielding panels are electrically connected to each other.

When the electromagnetic shielding panels of the present invention are assembled on a floor, a wall or the like for the structure of the electromagnetic shielding room, the electric connecting members 11 and 12 of the electromagnetic shielding panels are in contact with the electric connecting members 12 and 11 of another panel in the vicinity so that the conductive members 3 of respective panels are electrically integrated. A plurality of such panels can be assembled in the described manner linearly or with angles with each other.

Thus, the eddy current flows through the integrated conductive members 3 freely and the current path is not limited. Thus, it is possible to shield the room from high frequency effectively.

The ferromagnetic members 1 and 2 of the respective electromagnetic shielding panels are connected with the ferromagnetic members 1 and 2 of adjacent panels so that they are magnetically integrated. Thus, the lines of magnetic force pass through each panel freely, so that it is possible to form a room wall structure for effectively shielding the chamber of the room from the low frequency.

Although the spacer is made of FRP in the present embodiment, any material having electric insulating and non-magnetic properties may be used and it is permissible to use, for example, wood.

It may be possible to bond a wood plate, FRP plate or the like to the rear side of the ferromagnetic member 2 in order to reinforce the ferromagnetic member 2 although not shown in FIG. 2.

Next, an embodiment of the electromagnetic shielding exit/entrance structure, i.e. door structure, utilizing the electromagnetic body or electromagnetic panel described with reference to the former embodiments of the present invention will be described hereunder with reference to FIG. 3 (3A, 3B).

Referring to FIG. 3, the electromagnetic shielding exit/entrance structure of the present embodiment is provided with an electromagnetic shielding panel 21 constituting a wall structure of a room, for example, and the electromagnetic shielding exit/entrance structure includes an electromagnetic shielding door structure 22 which closes an opening 23 (23a, 23b) formed to the wall structure of the room.

Figure 3B:
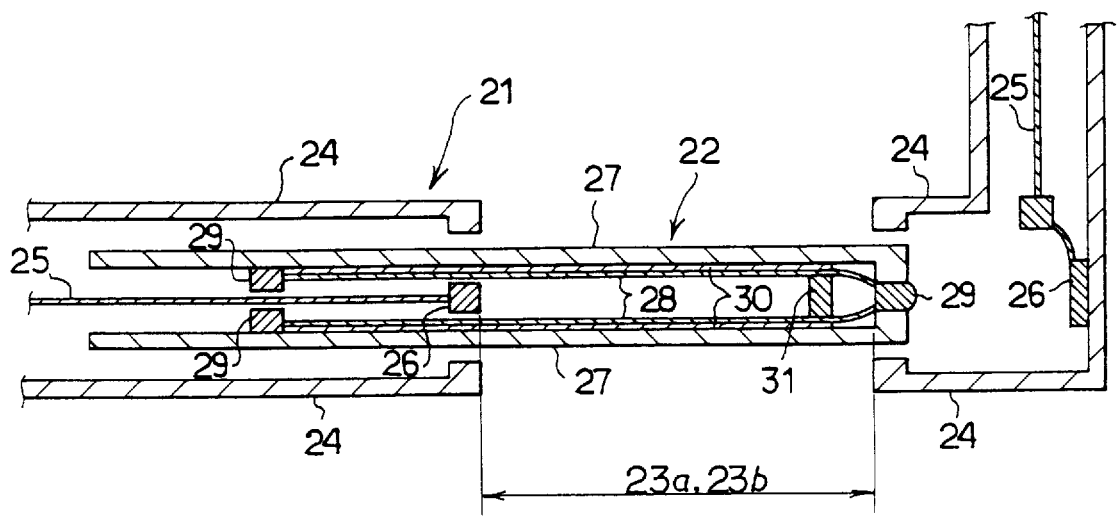
FIG. 3B is a horizontal sectional view taken along the lines IIIB—IIIB, in an enlarged scale, showing a detailed structure.

That is, as shown in FIG. 3B, the electromagnetic shielding panel 21 includes a ferromagnetic member 24 having a predetermined opening 23a as a cutout for exit and entrance, a conductive member 25 having an opening 23b which corresponds to the opening 23a and disposed substantially in parallel to the ferromagnetic member 24, and an electric connecting member 26 which is disposed along the edge line of the opening of the conductive member 25 and formed so as to be electrically integrated with the conductive member 25.

On the other hand, the electromagnetic shielding door 22 has a ferromagnetic member 27 having a surface area larger than the area of the opening 23a of the ferromagnetic member 24, a conductive member 28 which is located substantially in parallel to the ferromagnetic member 27, and an electric connecting member 29 which is disposed along an edge of the conductive member 28 and formed so as to be electrically integrated with the conductive member 28. The ferromagnetic members 24 and 27 are formed of the same material as the ferromagnetic member 1.

The conductive member 28 is formed of the same material as the conductive member 3, fixed to the ferromagnetic member 27 through a sheet material 30, such as FRP, and fixed by means of a pressing member 31 which is made of FRP or the like. The panel 21 has another opening at its edge portions defining the opening 23a, through which the door structure 22 is moved slidably.

The electromagnetic shielding door 22 is constructed so as to be able to move back and forth in a slidable manner in parallel to the faces of the electromagnetic shielding panel 21, within the electromagnetic shielding panel 21, and for this purpose, wheels or rollers are provided for the bottom of the door structure 22. The electric connecting member 26 of the electromagnetic shielding panel 21 and the electric connecting member 29 of the electromagnetic shielding door 22 are positioned so that the electric connecting member 26 and the electric connecting member 29 are in contact with each other at such a predetermined position in which the electromagnetic shielding door 22 shuts the opening 23a of the electromagnetic shielding panel 21.

With the structure described above, when the electromagnetic shielding door 22 is closed, referring to FIG. 3B, the electric connecting member 29 located at the right side of the electromagnetic shielding door 22 comes into contact with the electric connecting member 26 disposed at a corresponding position in the electromagnetic shielding panel 21. At the same time, a pair of electric connecting members 29 disposed at the left side of the electromagnetic shielding door 22 comes into contact with the electric connecting member 26 in the electromagnetic shielding panel 21.

Consequently, the conductive member 25 in the electromagnetic shielding panel 21 becomes electrically integrated with the conductive member 28 in the electromagnetic shielding door 22 thereby making it possible to shield the room from high frequency effectively.

When the electromagnetic shielding door 22 is closed, there is a slight gap between the ferromagnetic member 27 of the electromagnetic shielding door 22 and the ferromagnetic member 24 of the door electromagnetic shielding panel 21. However, because the gap is smaller than the width of the ferromagnetic member 27, most lines of magnetic force do not pass through the opening 23a but enter the ferromagnetic members 24, 27. Consequently, it is possible to shield low frequency by reducing leaking magnetic field.

In the present embodiment, the electromagnetic shielding panel 21 and an electromagnetic shielding door structure 22 are constructed by using the ferromagnetic members 24 and 27 which are made of the same material as that of the ferromagnetic member 1. As shown in FIG. 1 or 2, it may be possible to dispose a ferromagnetic member which is made of the same material as the ferromagnetic member 2, substantially in parallel to the ferromagnetic members 24 and 27.

FIGS. 4 to 8 show other embodiments according to the present invention representing electromagnetic shielding structure provided with through-hole(s) and an electromagnetic shielding room structure, which utilizes the electromagnetic shielding panel of FIG. 2, in an assembled manner, and which has a through-hole.

Figure 4:
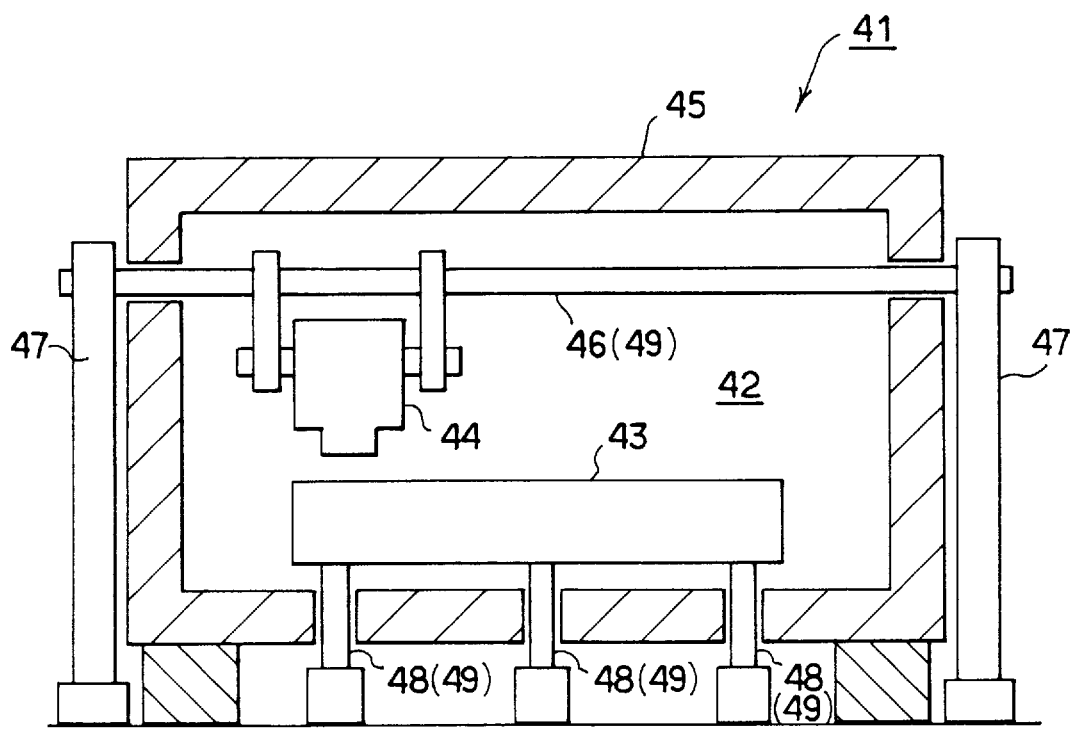
FIG. 4 is a vertical sectional view of an electromagnetic shielding room, such as a diagnosis room, to which the electromagnetic shielding structure according to the present invention is applied.

First, FIG. 4 is an electromagnetic shielding room structure formed in, for example, a diagnosis chamber in a hospital. Referring to FIG. 4, a bed 43 on which an examinee is to be laid and a dewar 44 containing a SQUID sensor are disposed and surrounded by means of electromagnetic shielding panels 45, having through-holes, constituting a wall structure of the room.

The dewar 44 is mounted on a gantry 46 and the gantry 46 is supported by means of supporting legs 47. The bed 43 is supported by means of supporting legs 48.

The electromagnetic shielding structure having a through-hole comprises the electromagnetic shielding panels 45, the gantry 46 which is placed through the electromagnetic shielding panel 45 and an insert body 49 such as the supporting legs 48 or the like.

Figure 5:
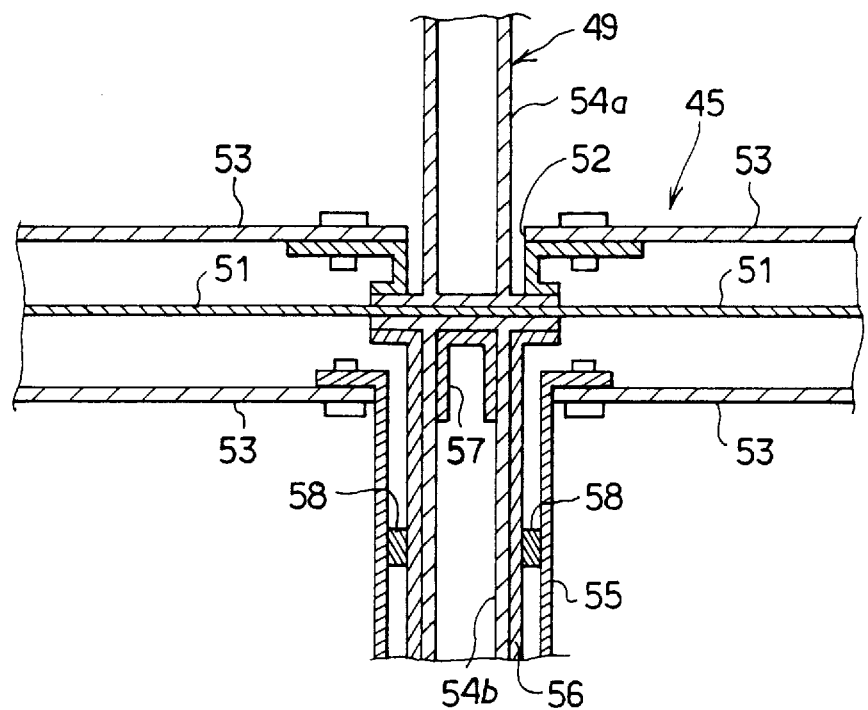
FIG. 5 is a sectional view showing an electromagnetic shielding structure provided with a through-hole according to a further embodiment of the present invention.

FIG. 5 shows the details of the electromagnetic shielding structure having the through-hole. In FIG. 5, the upper side shows the internal side of the room and the lower side shows the external side thereof. In this embodiment, the electromagnetic shielding panel 45 may be regarded as either a wall element or a floor element. As shown in FIG. 5, in the electromagnetic shielding panel 45, a conductive member 51 is disposed substantially in parallel to a ferromagnetic member 53 which has a through-hole 52.

The conductive member 51 is made of substantially the same material as the conductive member 3 of FIG. 1 and the ferromagnetic member 53 is made of substantially the same material as the ferromagnetic member 1 of FIG. 1. In the present embodiment, the panel structure near the through-hole 52 are shown, but the other portion thereof is formed by substantially the same structure as that shown in FIG. 2.

The cylindrical insert body 49 comprises two insert portions or members 54a and 54b which pass through the through-hole 52 and the two insert portions 54a and 54b are connected to each other with the conductive member 51 being interposed therebetween. Although the insert portions 54a and 54b may be formed of diamagnetic substance or non-magnetic substance, it is possible to form the insert portions of a weak paramagnetic substance such as aluminum or the like.

A cylindrical ferromagnetic member 55 which is formed of the same material as the ferromagnetic member 1 of FIG. 1 in the shape of a sleeve is disposed around the insert portion 54b. A ferromagnetic member 56 formed of the same material as the ferromagnetic member 1 is mounted on the outer surface of the insert portion 54b and a ferromagnetic member 57 formed of the same material as the ferromagnetic member 1 is provided inside the insert portion 54b.

The ferromagnetic member 55 formed in the shape of sleeve is magnetically connected to the ferromagnetic member 53, and further connected to the ferromagnetic member 56 via the ferromagnetic member 58. These ferromagnetic members 53, 55, 56 and 57 should be disposed so as not to receive stress generated in the insert portions 54a and 54b.

According to the structure described above, the conductive member 51 remains continuous even at a portion in which the insert body 49 is present. Thus, the eddy current flows freely to shield the room from high frequency effectively. The ferromagnetic members 55, 56 and 57 are provided near the insert portion 54b. The ferromagnetic member 55 is connected to the ferromagnetic member 53 and the ferromagnetic members 55 and 56 are connected to each other via the ferromagnetic member 58. Thus, lines of magnetic force existing near the through-hole 52 are concentrated to the ferromagnetic members 55 and 56 and likely to enter the ferromagnetic member 53 via these ferromagnetic members 55 and 56.

The lines of magnetic force passing near the center of the through-portion 54b is likely to enter the ferromagnetic member 53 through the ferromagnetic member 57. As a result, the lines of magnetic force passing through the through-hole 52 so as to enter the room decrease greatly thereby achieving the effective shielding from low frequency.

Figure 6:
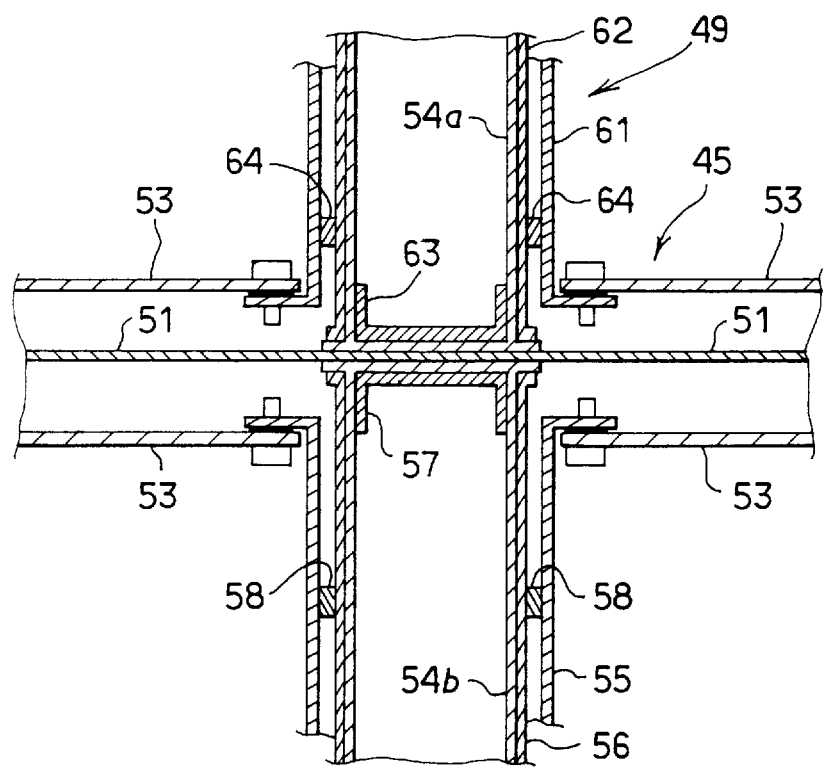
FIG. 6 a sectional view showing a modified embodiment of FIG. 5.

FIG. 6 is a modified embodiment of FIG. 6. The same reference numerals are attached to substantially the same parts of FIG. 5. The description thereof is omitted and only parts different from FIG. 5 will be described hereunder. According to the electromagnetic shielding structure having the through-hole shown in FIG. 6, ferromagnetic members 61, 62 and 63 are mounted around, on and inside the insert portion 54a, and the ferromagnetic member 61 is connected to the ferromagnetic member 53. The ferromagnetic members 61 and 62 are connected to each other via a ferromagnetic member 64.

With the structure described above, the lines of magnetic force entering the room through the through-hole 52 are greatly reduced thereby performing the effective shielding from the low frequency.

Figure 7:
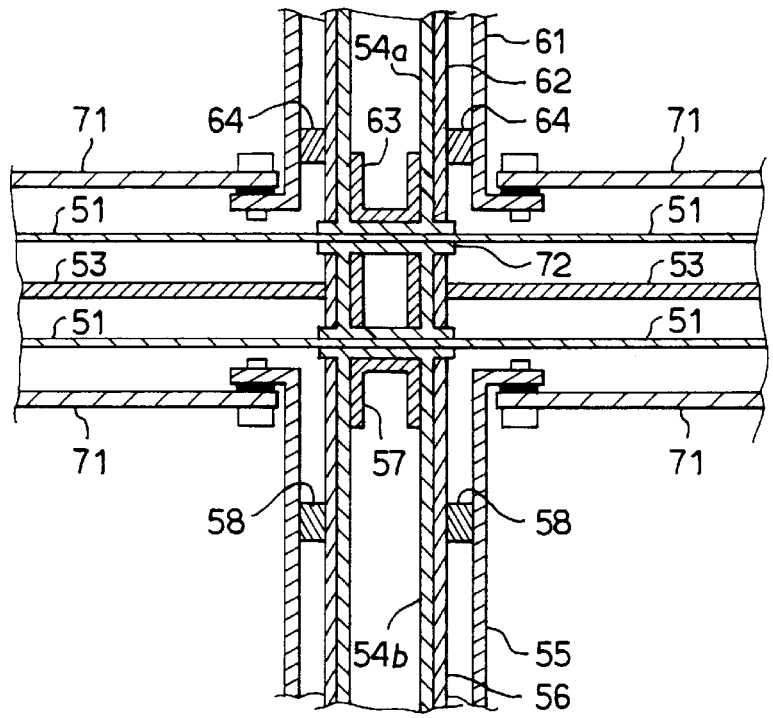
FIG. 7 of is a sectional view showing another embodiment of FIG. 5.

FIG. 7 is a further modified embodiment of FIG. 5. The same reference numerals are attached to substantially the same parts as in FIG. 5 or FIG. 6. The description thereof is omitted and parts different from FIG. 5 or FIG. 6 will be described hereunder.

That is, like the electromagnetic shielding panel shown in FIG. 2, an electromagnetic shielding panel having the electromagnetic shielding structure having a through-hole shown in FIG. 6 comprises a ferromagnetic member 53 formed of the same material as in the ferromagnetic member 1 of FIG. 1, and a ferromagnetic member 71 formed of the same material as in the ferromagnetic member 2 of FIG. 1. A conductive member 51 formed of the same material as in the conductive member 3 is disposed between the ferromagnetic members 53 and 71.

Two cylindrical insert portions 54a and 54b are connected to the conductive members 51 respectively so that a connecting member 72 is disposed between the conductive members 51. In this modified embodiment, a ferromagnetic member having a high relative magnetic permeability and a ferromagnetic member having a high saturation magnetization are used, and therefore, it is possible to further enhance shielding efficiency from low frequency as explained with reference to FIG. 2.

Figure 8:
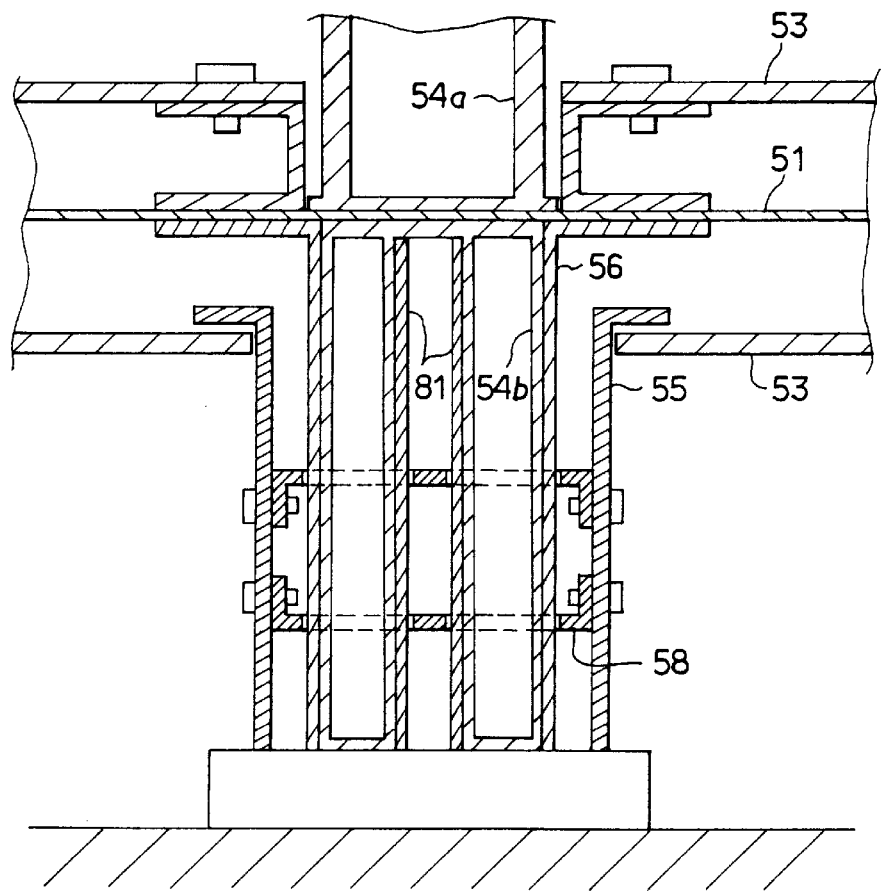
FIG. 8 is a vertical sectional view showing a further embodiment of FIG. 5.

FIG. 8 is still further modified embodiment of FIG. 5. The same reference numerals are attached to substantially the same parts as in FIGS. 5, 6 or FIG. 7. The description thereof is omitted and only parts different from FIGS. 5, 6 or 7 will be described hereunder. According to the electromagnetic shielding structure having a through-hole of this modified embodiment, particularly, the diameter or the width of the insert portion 54b is larger as compared with the height thereof. A ferromagnetic member 81 formed of the same material as the ferromagnetic member 1 of FIG. 1 is provided within the insert portion 54b.

With the described structure, when a large number of lines of magnetic force pass through the insert portion 54b, the lines of magnetic force which have entered the ferromagnetic member 81 are likely to enter the ferromagnetic member 53 via the ferromagnetic member 58.

The electromagnetic shielding panel of FIG. 2, the electromagnetic shielding door structure of FIG. 3 and the electromagnetic structure provided with through-holes of FIGS. 4 to 8, all basically utilizing the electromagnetic shielding body of FIG. 1, may be utilized in a total embodiment of the present invention to provide an electromagnetically shielding room structure, for example, in which a magnetic field generating source is located internally like an MRI (magnetic resonance imaging) apparatus or the like as well as a structure in which the magnetic field source is located externally, by suitably assembling these electromagnetic structural members.

That is, in such electromagnetic shielding room structure, a plurality of the electromagnetic shielding panels each of FIG. 2 will be basically utilized for forming the walls, floor and ceiling, the electromagnetic shielding door structure such as of FIG. 3 will be utilized for the exit/entrance structure of the room structure, and the electromagnetic shielding structure having through-holes such as of FIG. 5, for example, will be utilized for portions through which any insert members are to be inserted in a penetrating manner.

As described above, the electromagnetic shielding body of the present invention is formed by combining the first and second ferromagnetic members having different magnetic permeability. Consequently, it is possible to solve the problems regarding magnetic saturation and stress and to improve the capacity of the shielding from the low frequency without reducing the effect of the high frequency shielding.

The electromagnetic shielding panel according to the present invention includes ferromagnetic members, conductive members which are disposed substantially in parallel to the ferromagnetic members, and electric connecting members which are placed along the edge of the conductive members so that the electric connecting members are electrically integrated with the conductive members. Consequently, the conductive members are electrically integrated with the conductive members of another adjacent panel, so that eddy current is not restricted within each panel, thus being capable of flowing freely to thereby make it possible to effectively achieve the shielding from the high frequency.

Furthermore, the electromagnetic shielding door structure according to the present invention includes ferromagnetic members, conductive members which are disposed substantially in parallel to the ferromagnetic members and electric connecting members which are placed along the edge of the conductive members so that the electric connecting member is electrically integrated with the conductive members. Consequently, the conductive members are electrically integrated with the conductive members of an electromagnetic shielding panel for a door, thereby making it possible to effectively achieve the shielding from the high frequency.

Still furthermore, the electromagnetic shielding exit/entrance structure according to the present invention includes an electromagnetic shielding panel for a door which contains ferromagnetic members having an opening of a predetermined area, conductive members which have the other opening corresponding to the opening and which are disposed substantially in parallel to the ferromagnetic members and electric connecting members which are placed along the edge of the opening of the conductive members and which are electrically integrated with the conductive members, and an electromagnetic shielding door structure which contains ferromagnetic members which have an area larger than the area of the opening of the ferromagnetic members, conductive members which are disposed substantially in parallel to the ferromagnetic members and electric connecting members which are disposed along the edge of the conductive members and which are electrically integrated with the conductive members. The electromagnetic shielding door is constructed so as to be capable of moving back and forth within the the electromagnetic shielding panel, in parallel to the panel. Further, the electric connecting member of the electro-magnetic panel and the electric connecting member of the electromagnetic shielding door are positioned so as to contact each other at such a position in which the electromagnetic shielding door shuts the opening of the electromagnetic shielding panel for the door. As a result, when the electromagnetic shielding door is closed, the electric connecting members provided on the electromagnetic shielding door are in contact with the electric connecting members provided on the electromagnetic shielding panel so that the conductive members described above are electrically integrated with each other, thereby making it possible to effectively shield the high frequency.

Still furthermore, the electromagnetic shielding structure having a through hole includes an electromagnetic shielding panel which contain conductive members and ferromagnetic members having a hole, the conductive members and the ferromagnetic members being disposed substantially in parallel to each other, and an insert body which comprises to insert portions or members which pass through the through-hole. The two through portions are connected to each other via the conductive member so that the conductive member remains continuous at such a portion in which the through body is situated, thereby effectively achieving the shielding from the high frequency.

What is claimed is:

1. An electromagnetic shielding body comprising:
   a first ferromagnetic member;
   at least one second ferromagnetic member disposed substantially in parallel to the first ferromagnetic member with a space therebetween and having a magnetic permeability different from that of the first ferromagnetic member; and
   an electric conducting member disposed between and substantially in parallel to the first and second ferromagnetic members with spaces therebetween.

2. An electromagnetic shielding body according to claim 1, wherein said first ferromagnetic member is formed of a high magnetic permeability alloy, the main component of which is nickel, and said second ferromagnetic member is formed of iron.

3. An electromagnetic shielding body according to claim 1, wherein said second ferromagnetic member is disposed on a side at which a magnetic force is generated.

4. An electromagnetic shielding body according to claim 1, wherein said at least one second ferromagnetic member comprises two second ferromagnetic members respectively disposed on either side of the first ferromagnetic member in parallel thereto with spaces therebetween.

5. An electromagnetic shielding body according to claim 4, further comprising electric conducting members disposed between and substantially in parallel to the first and second ferromagnetic members with spaces therebetween.

6. A magnetic shielding room defined by a wall structure, said wall structure being comprised of a plurality of wall elements each being electrically connected and each being composed of at least one electromagnetic shielding panel which comprises:
   at least one ferromagnetic member formed in a shape of a panel;
   an electric conducting member formed in a shape of a panel and disposed substantially in parallel to the ferromagnetic member; and
   an electric connecting member electrically integrated with the electric conducting member, said electric connecting member being formed along an edge portion of the electric conducting member,
   wherein at least one of said wall elements is provided with an electromagnetic shielding exit/entrance structure which includes
   an electromagnetic shielding panel including at least one ferromagnetic member formed in a shape of a panel having a cutout portion forming a first opening, said first opening defining an edge portion, an electric conducting member formed in a shape of a panel and disposed substantially in parallel to the ferromagnetic member, said electric conducting member having an opening with a size corresponding to said first opening of the ferromagnetic member, and an electric connecting member electrically integrated with the electric conducting member, said electric connecting member being formed along an edge portion of the electric conducting member, and
   an electromagnetic shielding door member including at least one ferromagnetic member formed in a shape of a panel having a size larger than that of said first opening of the ferromagnetic member of said electromagnetic shielding panel, an electric conducting member formed in a shape of a panel and disposed substantially in parallel to the ferromagnetic member, and an electric connecting member electrically integrated with the electric conducting member, said electric connecting member being formed along an edge portion of the electric conducting member,
   wherein said electromagnetic shielding door member is fitted within the first opening of said electromagnetic shielding panel to be slidable so as to open or close the first opening, and
   wherein the electric connecting member of the electromagnetic shielding panel contacts the electric connecting member of the electromagnetic shielding door member when the electromagnetic shielding door member closes the first opening of the electromagnetic shielding panel.

7. An electromagnetic shielding room according to claim 6, wherein the at least one wall element is provided with an electromagnetic shielding structure having through-holes and electromagnetic shielding panels including ferromagnetic members connected to form said through-holes at portions corresponding to each other and an electric conducting member disposed between and substantially in parallel to the ferromagnetic members, and an insert body to be inserted into the through-holes of the electromagnetic shielding structure, said insert body including two insert portions which pass through said through-holes, said two insert portions being connected to each other with the electric conducting member being interposed therebetween.

8. An electromagnetic shielding panel adapted to be connected to at least a second electromagnetic shielding panel, comprising:
   a first ferromagnetic member;
   two second ferromagnetic members respectively disposed on either side of the first ferromagnetic member substantially in parallel to said first ferromagnetic member with spaces therebetween, wherein said second ferromagnetic members have a magnetic permeability smaller than that of said first ferromagnetic member;
   first and second electric conducting members, with said first electric conducting member disposed between said first ferromagnetic member and one of said second ferromagnetic members, and with said second electric conducting member disposed between said first ferromagnetic member and the other of said second ferromagnetic members;
   an electric connecting member electrically integrated with each of the electric conducting members, said electric connecting member being formed along an end portion of the electric conducting member;

wherein, upon connection to said second electromagnetic shielding panel, at least one of said ferromagnetic members is magnetically coupled to a ferromagnetic member of said second electromagnetic shielding panel, and the electric conducting member is electrically connected to an electric conducting member of said second electromagnetic shielding panel.

9. An electromagnetic shielding panel according to claim 8, wherein said end portion of said electric connecting member is connected to an adjacent end portion of an adjacent one of said ferromagnetic members through a spacer formed of an insulator.

10. An electromagnetic shielding panel according to claim 8, wherein said first ferromagnetic member is formed of a high magnetic permeability alloy, the main component of which is nickel, and said second ferromagnetic members are formed of iron.

11. An electromagnetic shielding panel according to claim 8, wherein end portions of said first and second ferromagnetic members and said electric connecting member are connected to each other through spacers formed of insulators.

12. An electromagnetic shielding exit/entrance structure comprising:

an electromagnetic shielding panel including at least one ferromagnetic member formed in a shape of a panel having a cutout portion forming a first opening, said first opening defining an edge portion, said electromagnetic shielding panel further including an electric conducting member formed in a shape of a panel and disposed substantially in parallel to the ferromagnetic member, said electric conducting member having an opening with a size corresponding to said first opening of the ferromagnetic member, and an electric connecting member electrically integrated with the electric conducting member, said electric connecting member being formed along an edge portion of the electric conducting member; and an electromagnetic shielding door member including at least one ferromagnetic member formed in a shape of a panel having a size larger than that of said first opening of the ferromagnetic member of said electromagnetic shielding panel, an electric conducting member formed in a shape of a panel and disposed substantially in parallel to the ferromagnetic member, and an electric connecting member electrically integrated with the electric conducting member, said electric connecting member being formed along an edge portion of the electric conducting member, wherein said electromagnetic shielding door member is fitted within the first opening of said electromagnetic shielding panel to be slidable so as to open or close the first opening, and wherein the electric connecting member of the electromagnetic shielding panel contacts the electric connecting member of the electromagnetic shielding door member when the electromagnetic shielding door member closes the first opening of the electromagnetic shielding panel.

13. An electromagnetic shielding structure having a through-hole comprising:

an electromagnetic shielding panel comprising ferromagnetic members provided with through-holes at portions corresponding to each other and an electric conducting member disposed between and substantially in parallel to the ferromagnetic members; and an insert body to be inserted into the through-holes of the ferromagnetic members, said insert body comprising two insert portions which pass through said through-holes, said two insert portions being connected to each other with the electric conducting member interposed therebetween.

14. An electromagnetic shielding structure according to claim 13, further comprising:

a pair of concentrically arranged ferromagnetic members disposed around at least one of the insert portions of the insert body, one of said pair being disposed on an outer peripheral surface of said at least one of the insert portions of the insert body; and another ferromagnetic member arranged between said pair of said ferromagnetic members.

15. An electromagnetic shielding structure according to claim 14, wherein said pair and said another ferromagnetic members are magnetically connected to each other.

16. An electromagnetic shielding structure according to claim 13, wherein said insert body is formed of a paramagnetic substance.

17. An electromagnetic shielding structure according to claim 13, wherein said ferromagnetic members include a first ferromagnetic members and second ferromagnetic members respectively disposed on each side of the first ferromagnetic member substantially in parallel to the first ferromagnetic member, the second ferromagnetic members having a magnetic permeability smaller than that of the first ferromagnetic member, said electric conducting member including first and second electric conducting members being disposed between the first ferromagnetic member and the second ferromagnetic members.

18. An electromagnetic shielding structure according to claim 13, wherein said insert body is formed of a diamagnetic substance or non-magnetic substance.

19. An electromagnetic shielding structure according to claim 13, further comprising another ferromagnetic member disposed around at least one of the insert portions of the insert body.

20. An electromagnetic shielding structure according to claim 19, wherein the another ferromagnetic member is magnetically connected to one of the ferromagnetic members of the electromagnetic shielding panel.

21. An electromagnetic shielding structure according to claim 19, further comprising still another ferromagnetic member disposed around at least one of the insert portions of the insert body.

22. An electromagnetic shielding structure according to claim 19, further comprising still another ferromagnetic member disposed on an outer peripheral surface of at least one of the insert portions of the insert body.

23. An electromagnetic shielding structure according to claim 19, further comprising still another ferromagnetic member disposed inside at least one of the insert portions of the insert body.

* * * * *